(12) United States Patent
Beyer et al.

(10) Patent No.: US 8,450,163 B2
(45) Date of Patent: May 28, 2013

(54) SEMICONDUCTOR DEVICE COMPRISING METAL GATES AND SEMICONDUCTOR RESISTORS FORMED ON THE BASIS OF A REPLACEMENT GATE APPROACH

(75) Inventors: Sven Beyer, Dresden (DE); Klaus Hempel, Dresden (DE); Roland Stejskal, Freital (DE); Andy Wei, Dresden (DE); Thilo Scheiper, Dresden (DE); Andreas Kurz, Dresden (DE); Uwe Griebenow, Markleeberg (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 76 days.

(21) Appl. No.: 12/963,364

(22) Filed: Dec. 8, 2010

(65) Prior Publication Data
US 2011/0266633 A1 Nov. 3, 2011

(30) Foreign Application Priority Data

Apr. 30, 2010 (DE) .......................... 10 2010 028 465

(51) Int. Cl.
*H01L 21/338* (2006.01)
*H01L 21/20* (2006.01)
*H01L 21/337* (2006.01)
*H01L 23/62* (2006.01)

(52) U.S. Cl.
USPC ............ 438/171; 438/382; 438/190; 257/359

(58) Field of Classification Search
USPC ................. 257/350, 358, 359, 360, 363, 379, 257/380, 516, 571, 577, E27.016, E27.023; 438/171, 190, 210, 238, 330, 382
See application file for complete search history.

(56) References Cited

U.S. PATENT DOCUMENTS

| 6,333,223 | B1 | 12/2001 | Moriwaki et al. | 438/241 |
| 6,406,956 | B1* | 6/2002 | Tsai et al. | 438/201 |
| 7,557,035 | B1* | 7/2009 | Ryan et al. | 438/638 |
| 2004/0070033 | A1* | 4/2004 | Shin | 257/379 |
| 2007/0096183 | A1* | 5/2007 | Ogawa et al. | 257/300 |
| 2009/0090977 | A1* | 4/2009 | Freeman et al. | 257/379 |
| 2009/0236669 | A1* | 9/2009 | Chen et al. | 257/380 |
| 2010/0019344 | A1 | 1/2010 | Chuang et al. | 257/516 |
| 2010/0052058 | A1* | 3/2010 | Hsu et al. | 257/364 |
| 2011/0117710 | A1* | 5/2011 | Lin et al. | 438/238 |

OTHER PUBLICATIONS

Translation of Official Communication from German Patent Office for German Patent Application No. 10 2010 028 465.3 dated Feb. 9, 2011.

* cited by examiner

*Primary Examiner* — Matthew Landau
*Assistant Examiner* — Khaja Ahmad
(74) *Attorney, Agent, or Firm* — Williams, Morgan & Amerson, P.C.

(57) ABSTRACT

In a replacement gate approach, the semiconductor material or at least a significant portion thereof in a non-transistor structure, such as a precision resistor, an electronic fuse and the like, may be preserved upon replacing the semiconductor material in the gate electrode structures. To this end, an appropriate dielectric material may be provided at least prior to the removal of the semiconductor material in the gate electrode structures, without requiring significant modifications of established replacement gate approaches.

19 Claims, 11 Drawing Sheets

SEMICONDUCTOR DEVICE COMPRISING METAL GATES AND SEMICONDUCTOR RESISTORS FORMED ON THE BASIS OF A REPLACEMENT GATE APPROACH

BACKGROUND OF THE INVENTION

1. Field of the Invention

The present disclosure generally relates to the field of fabricating integrated circuits, and, more particularly, to resistors or other non-transistor elements in complex integrated circuits that comprise field effect transistors including metal gate electrode structures.

2. Description of the Related Art

In modern integrated circuits, a great number of individual circuit elements, such as field effect transistors in the form of CMOS, NMOS, PMOS elements, and non-transistor components, such as resistors, capacitors and the like, are formed on a single chip area. Typically, feature sizes of these circuit elements are continuously reduced with the introduction of new circuit generations, thereby providing currently available integrated circuits with a high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

In addition to the large number of transistor elements, a plurality of passive circuit elements, such as capacitors and resistors, are typically formed in integrated circuits as required by the basic circuit layout. Due to the decreased dimensions of circuit elements, not only the performance of the individual transistor elements may be improved, but also their packing density is significantly increased, thereby providing the potential for incorporating increased functionality into a given chip area. For this reason, highly complex circuits have been developed, which may include different types of circuits, such as analog circuits, digital circuits and the like, thereby providing entire systems on a single chip (SOC).

Although transistor elements are the dominant circuit elements in highly complex integrated circuits and substantially determine the overall performance of these devices, other components, such as capacitors and resistors, are required, wherein the size of these passive circuit elements may also have to be adjusted with respect to the scaling of the transistor elements in order to not unduly consume valuable chip area. Moreover, the passive circuit elements, such as the resistors, may have to be provided with a high degree of accuracy in order to meet tightly set margins according to the basic circuit design. For example, even in substantially digital circuit designs, corresponding resistance values of so-called precision resistors have to be provided within tightly set tolerance ranges so as to not unduly contribute to operational instabilities and/or enhanced signal propagation delay. For example, in sophisticated applications, precision resistors may frequently be provided in the form of integrated polysilicon resistors, which may be formed above isolation structures so as to obtain the desired resistance value within the predefined tolerances without significantly contributing to parasitic capacitance, as may be the case in buried resistive structures, which may be formed within the active semiconductor layer. A typical polysilicon resistor may thus require the deposition of the basic polysilicon material, which may frequently be combined with the deposition of a polysilicon gate electrode material for the transistor elements. During the patterning of the gate electrode structures, the resistors may also be formed, the size of which may significantly depend on the basic specific resistance value of the polysilicon material and the type of dopant material and concentration that may be incorporated into the resistors so as to adjust the resistance values.

The continuous drive to shrink the feature sizes of complex integrated circuits has resulted in a gate length of field effect transistors of approximately 50 nm and less. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, referred to as a channel region, that is disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon forming a conductive channel due to the application of an appropriate control voltage to the gate electrode, depends on the dopant concentration of the drain and source regions, the mobility of the charge carriers and, for a given transistor width, on the distance between the source region and the drain region, which is also referred to as channel length.

Presently, most complex integrated circuits are based on silicon due to the substantially unlimited availability, the well-understood characteristics of silicon and related materials and processes and due to the experience gathered during the last 50 years. Therefore, silicon will likely remain the material of choice for future circuit generations. One reason for the important role of silicon for the fabrication of semiconductor devices has been the superior characteristics of a silicon/silicon dioxide interface that allows a reliable electrical insulation of different regions from each other. The silicon/silicon dioxide interface is stable at high temperatures and, thus, allows high temperature processes to be performed, as are typically required for anneal processes in order to activate dopants and to cure crystal damage without sacrificing the electrical characteristics of the interface. Consequently, in field effect transistors, silicon dioxide has preferably been used as a gate insulation layer which separates the gate electrode, frequently comprised of polysilicon, from the silicon channel region. Upon further device scaling, however, the reduction of channel length may require a corresponding adaptation of the thickness of the silicon dioxide gate dielectric in order to substantially avoid a so-called short channel behavior, according to which variability in channel length may have a significant influence on the resulting threshold voltage of the transistor. Aggressively scaled transistor devices with a relatively low supply voltage, and thus a reduced threshold voltage, therefore, suffer from a significant increase of the leakage current caused by the reduced thickness of a silicon dioxide gate dielectric. For example, a channel length of approximately 0.08 µm may require a gate dielectric made of silicon dioxide as thin as approximately 1.2 nm in order to maintain the required capacitive coupling between the gate electrode and the channel region. Although high speed transistor elements having an extremely short channel may, in general, preferably be used in high speed signal paths, whereas transistors with a longer channel may be used for less critical signal paths, the relatively high leakage current caused by the direct tunneling of charge carriers through the ultra-thin silicon dioxide gate dielectric of the high speed transistor elements may reach values for an oxide thickness in the range of 1-2 nm that may no longer be compatible with thermal design power requirements for any type of complex integrated circuit system.

For this reason, replacing silicon dioxide as the base material for gate insulation layers has been considered, particularly for highly sophisticated applications. Possible alternative materials include such materials that exhibit a significantly higher permittivity, so that a physically greater thickness of a correspondingly formed gate insulation layer provides a capacitive coupling that would be obtained by an extremely thin silicon dioxide layer. It has been suggested to replace silicon dioxide with high permittivity materials, such as tantalum oxide, strontium titanium oxide, hafnium oxide, hafnium silicon oxide, zirconium oxide and the like.

Additionally, transistor performance may further be increased by providing an appropriate conductive material for the gate electrode in order to replace the usually used polysilicon material, since polysilicon may suffer from charge carrier depletion at the vicinity of the interface positioned between the gate dielectric material and the polysilicon material, thereby reducing the effective capacitance between the channel region and the gate electrode during transistor operation. Thus, a gate stack has been suggested in which a high-k dielectric material provides enhanced capacitance, while additionally maintaining any leakage currents at an acceptable level. Since the non-polysilicon material, such as titanium nitride and the like, may be formed such that it may be in direct contact with the gate dielectric material, the presence of a depletion zone may thus be avoided, while, at the same time, a moderately high conductivity may be achieved by also using a highly conductive metal, such as aluminum, as a further electrode material.

As is well known, the threshold voltage of the transistor may depend on the overall transistor configuration, on a complex lateral and vertical dopant profile of the drain and source regions, the corresponding configuration of the PN junctions and on the work function of the gate electrode material. Consequently, in addition to providing the desired dopant profiles, the work function of the metal-containing gate electrode material also has to be appropriately adjusted with respect to the conductivity type of the transistor under consideration. For this reason, typically, metal-containing electrode materials may be used for N-channel transistors and P-channel transistors, which may be provided according to well-established manufacturing strategies in a very advanced manufacturing stage. That is, in these approaches, a gate layer stack comprising a dielectric and a polysilicon material in combination with other materials, if required, is provided and then patterned in order to form a gate electrode structure. Concurrently, corresponding resistors and other non-transistor elements, such as electronic fuses, may be patterned. Thereafter, the basic transistor configuration may be completed by forming drain and source regions, performing anneal processes and finally embedding the transistors in a dielectric material.

Next a process sequence follows, in which the top surface of the polysilicon material is exposed, which is typically accomplished by a first substantially selective chemical mechanical polishing (CMP) process, in which the interlayer dielectric material is planarized and thus removed. To this end, well-established polishing recipes are applied for removing silicon dioxide material, wherein the silicon nitride material, which is typically used as an etch stop layer in the contact levels of semiconductor devices, may act as a control layer together with the silicon nitride cap materials provided on top of the polysilicon material. Thereafter, the polishing recipe is changed so as to provide a substantially non-selective removal behavior so that silicon nitride material and silicon dioxide material may be removed with substantially the same removal rate, thereby preserving a substantially planar surface topography, while at the same time increasingly removing the dielectric cap material so as to finally expose the top surface of the polysilicon materials. After the exposure of the polysilicon material, highly selective etch recipes are applied, for instance on the basis of well-established wet chemical chemistries, thereby removing the polysilicon material in the gate electrode structures and also in the non-transistor structures, such as resistive structures, electronic fuses and the like. By depositing the high-k dielectric material, any appropriate work function metals and a highly conductive electrode metal, the gate electrode structures may be completed and thus have a desired superior electronic performance, while, on the other hand, the non-transistor structures may exhibit a quite different behavior compared to well-established resistors and electronic fuses formed on the basis of polysilicon material. That is, due to the high conductivity, any resistive structures, such as resistors and electronic fuses, would not properly function unless significant redesigns, for instance in terms of increasing the length of these structures, are applied. Any such significant redesigns, however, would result in undue consumption of chip area. For these reasons, frequently, non-transistor structures, such as resistors and electronic fuses, may be formed in the metallization system of the semiconductor device, thereby, however, also requiring significant redesigns and additional research and development efforts, since metal-based resistors and fuses may have a quite different electronic behavior.

In other conventional strategies, the non-transistor structures are provided in the active semiconductor layer so as to avoid any influence of the replacement gate approach on the non-transistor components. The incorporation of resistors and electronic fuses into the active semiconductor material may, however, result in a significant increase of the parasitic capacitance, which, thus, may significantly restrict the application of this concept in view of high frequency devices. Moreover, by forming electronic fuses in the active semiconductor material of bulk devices, i.e., of semiconductor devices in which the active silicon layer is not isolated from the remaining substrate material by a buried insulating layer that typically exhibits a significantly lower thermal conductivity compared to the bulk semiconductor material, a reliable programming of these electronic fuses may require significantly higher programming currents due to superior thermal coupling of the electronic fuse to the substrate material.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which non-transistor structures, such as resistors, electronic fuses and the like, may be formed on the basis of an appropriate semiconductor material, such as polysilicon, silicon/germanium and the like, while, at the same time, sophisticated high-k metal gate electrode structures may be fabricated on the basis of a replacement gate approach. To this end, the semiconductor material of the non-transistor structures may be reliably masked upon exposing the semiconductor material in the gate electrode structures, which may be accomplished by providing an efficient mask material above the non-transistor structures prior to replacing the semiconductor material in the gate electrode structures. For this purpose, in some illustrative aspects disclosed herein, a very efficient process module may be applied in an intermediate stage of the material removal process exposing the top surface of the semiconductor material in a conventional replacement gate approach, in which the semiconductor material of the non-transistor structure may be selectively exposed and recessed and refilled so that the recessed semiconductor material may be reliably preserved upon further processing on the basis of a replacement gate approach.

In other illustrative aspects disclosed herein, an appropriate etch mask may be applied after exposing the semiconductor material in the gate electrode structures and the non-transistor structures, thereby enabling selective removal of the semiconductor material in the gate electrode structures. Consequently, the principles disclosed herein provide a high degree of compatibility with conventional replacement gate approaches, while, at the same time, a high flexibility is achieved, for instance, in terms of adjusting resistance values of critical non-transistor structures, such as precision resistors, providing metal silicide contact areas, if required, and the like.

One illustrative method disclosed herein relates to forming a semiconductor device. The method comprises forming a mask having a mask opening aligned to a non-transistor structure, wherein the mask covers a gate electrode structure, and wherein the gate electrode structure and the non-transistor structure comprise a semiconductor material and are at least laterally embedded in an interlayer dielectric material. The method further comprises exposing a surface of the semiconductor material selectively in the non-transistor structure in the presence of the mask. Additionally, the method comprises removing a portion of the exposed semiconductor material and forming a dielectric material above the gate electrode structure and the non-transistor structure after the removal of the portion of the exposed semiconductor material. Furthermore, a surface of the semiconductor material is exposed in the gate electrode structure, while a portion of the dielectric material layer is preserved above the non-transistor structure. Additionally, the semiconductor material in the gate electrode structure is replaced with at least a metal-containing electrode material, while the semiconductor material in the non-transistor structure is preserved.

A further illustrative method disclosed herein relates to forming a semiconductor device. The method comprises forming a gate electrode structure above an active region and a non-transistor structure above an isolation structure, wherein the gate electrode structure and the non-transistor structure comprise a semiconductor material and a dielectric cap material formed above the semiconductor material. The method further comprises forming a sidewall spacer structure on sidewalls of the gate electrode structure and the non-transistor structure. Moreover, the dielectric cap layer is selectively removed in contact areas of the non-transistor structure, while the dielectric cap layer is preserved in the gate electrode structure and a portion of the non-transistor structure. The method further comprises forming contact areas in drain and source regions of the active region in the presence of the preserved dielectric cap layer. Moreover, a dielectric material is formed so as to laterally enclose the gate electrode structure and the non-transistor structure. Additionally, the method comprises replacing the semiconductor material by at least a metal-containing electrode material selectively in the gate electrode structure, while preserving at least a portion of the semiconductor material in the non-transistor structure.

One illustrative semiconductor device disclosed herein comprises a gate electrode structure of a transistor formed above an active region and comprising a high-k dielectric material and a metal electrode material. The semiconductor device further comprises a non-transistor structure formed above an isolation region and comprising a metal silicide region and a non-silicided silicon-containing semiconductor material. Additionally, the semiconductor device comprises a contact level comprising an interlayer dielectric material and a first contact element extending to the active region and a second contact element extending to the metal silicide region of the non-transistor structure.

BRIEF DESCRIPTION OF THE DRAWINGS

The disclosure may be understood by reference to the following description taken in conjunction with the accompanying drawings, in which like reference numerals identify like elements, and in which.

Figure 1A:
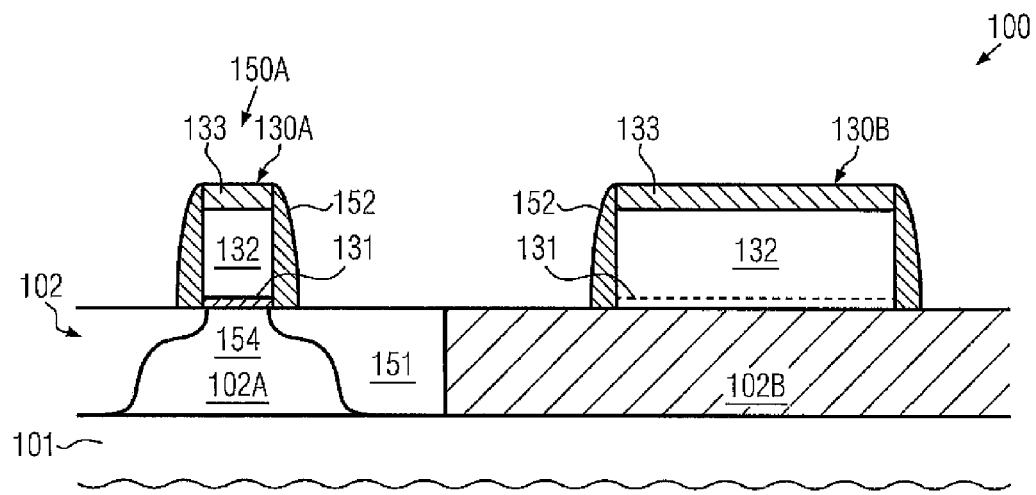
FIG. 1a schematically illustrates a cross-sectional view of a semiconductor device comprising a transistor and a non-transistor structure in an advanced manufacturing stage.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which sophisticated high-k metal gate electrode structures may be provided on the basis of replacement gate approaches, while, concurrently, other non-transistor structures, such as resistors, electronic fuses and the like, may be formed on the basis of the semiconductor material which acts as a placeholder material in the transistors during the replacement gate approach. At least a significant portion of the initial semiconductor material may be efficiently preserved in the non-transistor structures by efficiently forming a mask material above the non-transistor structures, for instance after recessing the semiconductor material in some illustrative embodiments, while, in other cases, the mask material may be applied without specifically recessing the semiconductor material. Consequently, upon replacing the semiconductor material, such as the polysilicon material, in the gate electrode structures with at least a metal-containing electrode material, a modification of the semiconductor material in the non-transistor structures, such as resistors, electronic fuses and the like, may be efficiently suppressed so that well-established concepts and designs of any such non-transistor structures may be applied, while at the same time enabling the application of sophisticated replacement gate approaches. For example, well-established geometric concepts and material compositions, dopant concentrations and the like may be used for resistors, electronic fuses and the like, wherein these non-transistor structures may be formed above isolation structures, thereby providing superior thermal decoupling of resistors and electronic fuses from the substrate material and also reducing the parasitic capacitance. Therefore, the concepts disclosed herein may be efficiently applied to silicon-on-insulator (SOI) and bulk configurations, without requiring a significant modification, as are typically required in approaches in which any such structures are incorporated into the active semiconductor material.

In some illustrative embodiments disclosed herein, the efficient capping of the semiconductor material, or at least a portion thereof, in the non-transistor structure may be accomplished with a high degree of compatibility with replacement gate approaches so that well-established concepts, in particular in view of the complex polishing sequence for exposing the semiconductor material in the gate electrode structures, may be applied in a substantially non-modified version, or a corresponding modification may not require significant process redesigns. Moreover, in some illustrative embodiments, the masking of the semiconductor material in the non-transistor structure may be achieved by forming a recess therein, which may also provide the possibility of appropriately adjusting the electronic characteristics, for instance when forming precision resistors, since the actual cross-sectional area for given lateral dimensions may be efficiently adjusted by controlling the depth of the recess. Furthermore, in some illustrative embodiments, in which metal silicide contact areas may be required and these silicide contact areas are formed in a late manufacturing stage, the incorporation of a dopant species for adjusting the specific resistivity of the semiconductor material may be accomplished on the basis of superior implantation conditions, wherein, in some cases, an etch mask may be efficiently used as a implantation mask, thereby avoiding additional lithography processes.

In still other illustrative embodiments disclosed herein, contact areas in the non-transistor structures may be efficiently provided on the basis of metal silicide material, which may be formed in a process stage in which the semiconductor material in the gate electrode structures is reliably confined by the dielectric cap material and the sidewall spacer structure. Consequently, any desired metal silicide configuration may be established selectively in the semiconductor material of the non-transistor structures, without negatively affecting the further processing according to the replacement gate approach.

FIG. 1a schematically illustrates a cross-sectional view of a semiconductor device 100 in an advanced manufacturing stage. As illustrated, the device 100 may comprise a substrate 101, above which may be formed a semiconductor layer 102, such as a silicon layer, a silicon/germanium layer, a germanium layer and the like. It should be understood that the semiconductor layer 102 is, in its initial state, a semiconductor material that is appropriate for forming therein and thereon semiconductor-based circuit elements, such as transistors and the like. In the manufacturing stage shown, the semiconductor layer 102 may comprise a plurality of active regions, which are to be understood as semiconductor regions that are laterally delineated by appropriate isolation structures. For convenience, a single active region 102A and a single isolation structure 102B are illustrated in FIG. 1a. It should be appreciated that the isolation region 102B may not necessarily be formed adjacent to the active region 102A, as is shown in FIG. 1a, but may be positioned at any appropriate location of the device 100 in accordance with the overall design requirement. The active region 102A may represent the semiconductor material for forming therein drain and source regions 151 of a transistor 150A, which may also comprise a gate electrode structure 130A, which, in the manufacturing stage shown, may include a dielectric material 131, such as a conventional dielectric material in the form of silicon dioxide, silicon oxynitride and the like, possibly in combination with a high-k dielectric material, depending on the overall process strategy. Furthermore, the gate electrode structure 130A may comprise a semiconductor material 132, such as a polysilicon material, a silicon/germanium material and the like. Furthermore, a dielectric cap material 133, for instance comprising silicon nitride and the like, may be formed above the semiconductor material 132. Additionally, a spacer structure 152, which may comprise a plurality of individual spacer elements (not shown), may be formed on sidewalls of the gate electrode structure 130A. It should be appreciated that critical dimensions of the gate electrode structure 130A, for instance a gate length, i.e., in FIG. 1a, the horizontal extension of the material 132, may be selected to be approximately 50 nm and significantly less, when sophisticated applications are considered. Furthermore, as indicated above and as will be described in more detail later on, the material 132, possibly in combination with the material 131 or a portion thereof, may be replaced by any other appropriate materials in a later manufacturing stage.

Furthermore, a non-transistor structure 130B may be provided above the isolation region 102B and may be considered as an electrode-like circuit component, which may have to provide certain electronic characteristics in terms of conductivity and the like. For example, the non-transistor structure 130B may represent a semiconductor-based resistor, which may require a precisely defined resistance value, as explained above. Hence, by forming the structure 130B on or above the isolation region 102B, the parasitic capacitance may be reduced, for instance compared to approaches in which a resistor may be formed in a portion of the semiconductor layer 102, as is also previously explained. The structure 130B may have basically the same configuration as the gate electrode structure 130A, i.e., in terms of material composition, while any lateral dimensions of the structure 130B may be selected in accordance with the electronic characteristics required for the component 130B. As indicated above, for polysilicon or silicon/germanium, appropriate designs and expertise may be available for forming precision resistors and the like. In other cases, the structure 130B may represent an electronic fuse. As is well known, in sophisticated applications, a plurality of different circuit portions may be implemented into the same semiconductor die, thereby requiring the cooperation of the different circuit portions, which may differ in operating speed and the like. Moreover, the behavior of certain circuit components over time may be different and may, thus, require a re-adjustment on a regular basis or on demand. Similarly, process-related variations may have to be compensated for in an advanced manufacturing stage, wherein, frequently, so-called electronic fuses may be used, which may represent one time programmable circuit element, which, thus, enable a reliable selection of one or of a plurality of circuit configurations defined by a set of electronic fuses. Typically, the programming event may rely on specifically defined electronic characteristics of the electronic fuse so as to establish a well-defined permanent highly conductive state on the basis of using irreversible modifications in the material of the electronic fuse by applying a high programming current pulse. For this purpose, polysilicon electronic fuses have been successfully used in semiconductor devices, which, however, may not be compatible with conventional replacement gate approaches, as described above.

The semiconductor device 100 as illustrated in FIG. 1a may be formed on the basis of any appropriate process technique. For example, the active region 102A may be formed by providing trenches in the semiconductor layer 102 and refilling the trenches with any appropriate insulating material, thereby forming the isolation structures and also the isolation region 102B, at the same time laterally delineating the active region 102A. Prior to or after forming the isolation structures, appropriate dopant species may be incorporated into the active region 102A so as to define the basic transistor characteristics. Next, the dielectric material 131 may be formed, for instance, by deposition, oxidation and the like, if a conventional dielectric material is to be provided. In other cases, in addition to providing a conventional dielectric material, a high-k dielectric material in combination with a metal-containing cap material may also be provided, as will be described later on in more detail. Thereafter, the semiconductor material 132 may be deposited, followed by the deposition of one or more additional materials for forming the dielectric cap material 133, wherein, typically, the material 133 is substantially comprised of silicon nitride. Furthermore, any other materials, such as hard mask materials, anti-reflective coating (ARC) materials and the like, may be applied and may be subsequently patterned on the basis of sophisticated lithography and etch techniques. During the patterning process, the gate electrode structure 130A and the non-transistor structure 130B are provided with the desired lateral dimensions, while the height of these structures is determined by the layer thickness of the previously applied materials 132, 133. In some illustrative embodiments, the thickness of the material 132 may be selected so as to comply with the further processing, for instance in terms of ion blocking effect, when forming the drain and source regions 151 by ion implantation, in which the gate electrode structure 130A may act as an implantation mask in order to suppress any undue incorporation of dopant species in a channel region 154 of the transistor 150A. On the other hand, the thickness or height of the material 132 may be appropriately adapted in the structure 130B in a later manufacturing stage, if the initial height may not be compatible with the desired overall electronic behavior of the structure 130B. It should be appreciated that the basic specific resistivity of the material 132 may be adjusted on the basis of ion implantation, for instance prior to patterning the material 132, which may be accomplished by a non-mask implantation process, when basically the same resistivity is required in any non-resistor structure, while, in other cases, a sequence of masked implantation steps may be applied if different resistivities are to be used in various non-transistor structures. In other cases, the material 132 may be provided with a certain concentration of a dopant species upon depositing material 132. In other illustrative embodiments, the adjustment of the specific resistance value of the structures 130B may be accomplished in a later manufacturing stage, thereby providing superior uniformity when patterning the structures 130A, 130B, since the etch behavior of the material 132 may be substantially identical across the entire device 100.

If required, any additional mechanisms may be implemented, for instance by incorporating a strain-inducing semiconductor material in at least some transistor elements in order to further enhance overall performance of these transistors. Next, the spacer structure 152 may be formed in combination with intermediate implantation steps so as to define the dopant profile for the drain and source regions 151. Similarly, the spacer structure 152 is also formed on sidewalls of the structure 130B.

Figure 1B:
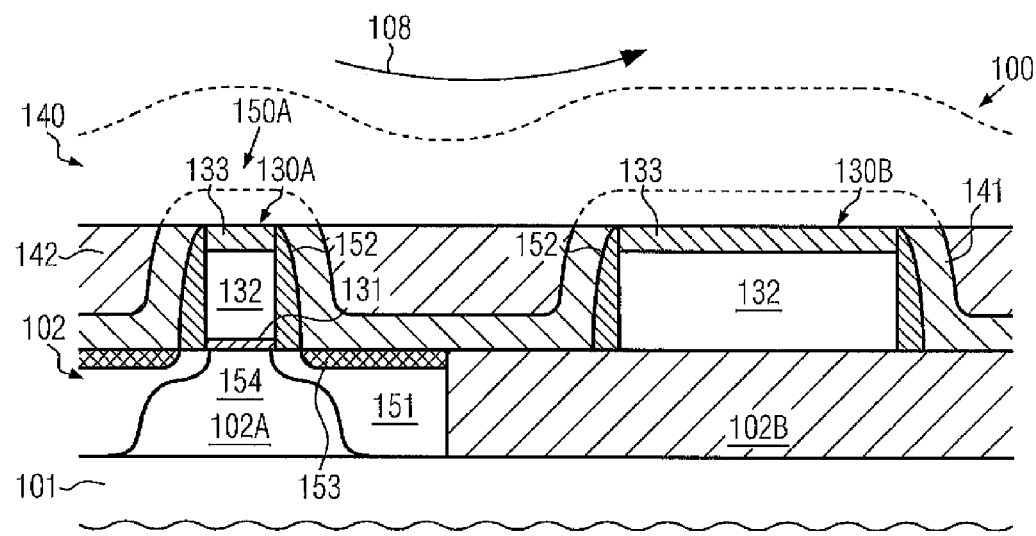
FIG. 1b schematically illustrates the semiconductor device in a further advanced manufacturing stage according to illustrative embodiments in which an interlayer dielectric material may be provided in combination with metal silicide regions in the transistors.

FIG. 1b schematically illustrates the device 100 in a further advanced manufacturing stage according to some illustrative embodiments. As shown, in some approaches, a metal silicide material 153 may be formed in the drain and source regions 151, the dopant profile of which may have been adjusted on the basis of any appropriate anneal processes. In the embodiment shown, a metal silicide may not be formed in the structure 130B, if considered appropriate for the further processing of the device 100. In other cases, as will be described later on, appropriate contact areas may also be formed on the basis of metal silicide in the structure 130B, depending on the overall process strategy. In still other illustrative embodiments, the further processing may be continued on the basis of the configuration as shown in FIG. 1a without forming a metal silicide, when, for example, additional high temperature processes are required in a later stage. In this case, the metal silicide may be formed after any such high temperature processes by forming contact openings and locally siliciding exposed areas of the drain and source regions 151 (not shown). Furthermore, a contact level 140 or at least a portion thereof may be provided, for instance, in the form of any appropriate dielectric material, such as a silicon nitride material 141, a silicon dioxide material 142 and the like. The dielectric material of the contact level 140 may be provided on the basis of well-established process techniques, such as plasma enhanced chemical vapor deposition (CVD), sub-atmospheric CVD, high density plasma CVD and the like. After the deposition of the materials 141, 142, a material removal process 108 may be performed, which may, according to some illustrative embodiments, comprise a polishing process based on well-established recipes, in which preferably the material of the layer 142 may be removed. For example, efficient CMP recipes for polishing silicon dioxide material may be applied, wherein process parameters and slurry composition are typically selected so as to provide a certain degree of selectivity with respect to, for instance, silicon nitride, which may be provided in the form of the layer 141. Consequently, during the polishing process 108, the initial surface topography may be increasingly smoothed wherein finally the top surface of the layer 141 may be exposed, which may thus be used as a material for efficiently controlling the removal process 108. In a final phase of the process 108, the material 141 may be removed to a certain degree so that the material 132 may still remain covered by at least the dielectric cap layer 133, possibly in combination with a portion of the material layer 141.

Figure 1C:
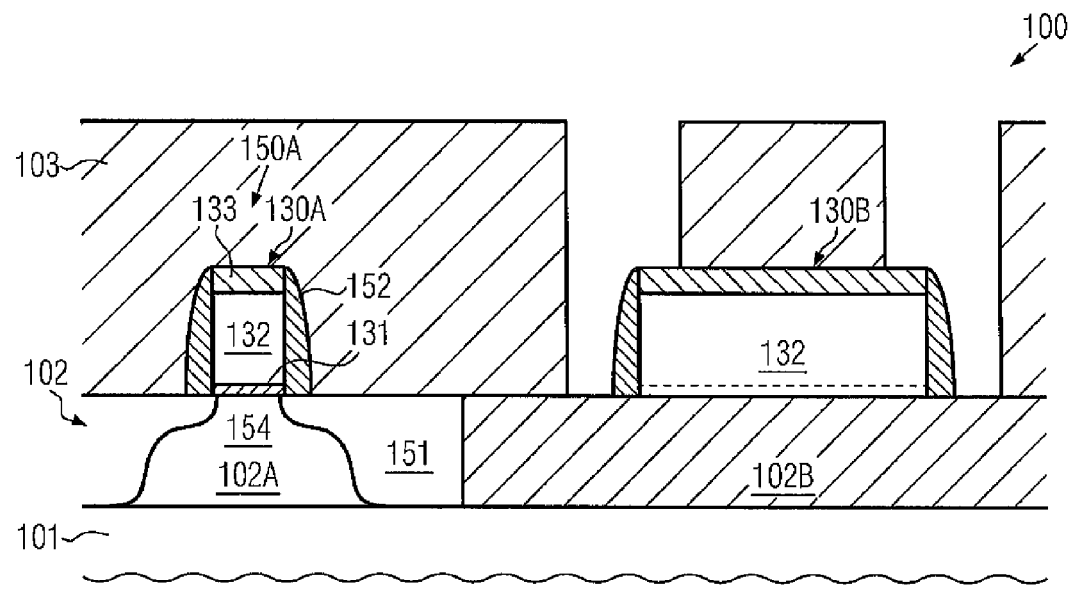
FIGS. 1c-1e schematically illustrate cross-sectional views of the semiconductor device in various manufacturing stages when starting from the device as shown in FIG. 1a, according to further illustrative embodiments in which metal silicide contact areas may be formed in the non-transistor structure.

FIG. 1c schematically illustrates the semiconductor device 100 according to illustrative embodiments in which contact areas based on metal silicide may be provided in the non-transistor structure 130B together with metal silicide in the drain and source regions 151. To this end, an etch mask 103 may be provided, for instance in the form of a resist mask, which may comprise appropriate openings so as to expose respective areas of the structure 130B, such as end portions thereof. To this end, any appropriate lithography technique may be applied.

Figure 1D:
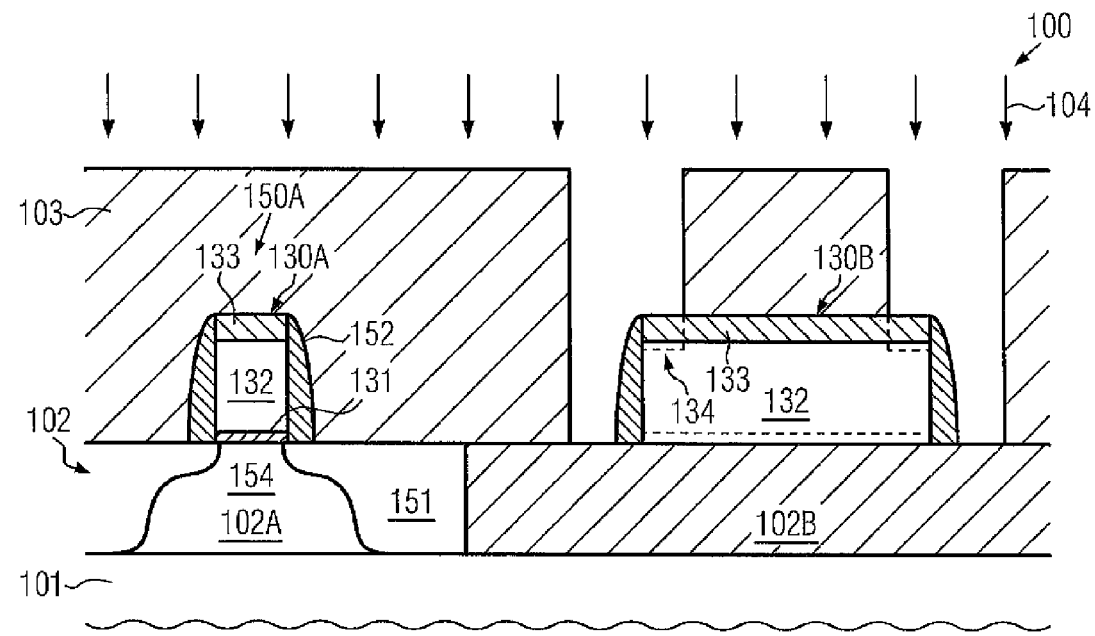

FIG. 1d schematically illustrates the semiconductor device 100 when exposed to a reactive etch ambient 104, which may be established on the basis of plasma assisted etch recipes in order to remove material of the dielectric cap layer 133 in the structure 130B. For this purpose, well-established selective etch chemistries are available for, for instance, efficiently removing silicon nitride material selectively with respect to, for instance, silicon dioxide, silicon and the like. For example, some plasma assisted etch recipes for removing silicon nitride material may result in a modification of silicon material, thereby forming a silicon dioxide material, which in turn may then act as a very efficient etch stop material. Consequently, during the etch process 104, exposed portions of the layer 133 may be efficiently removed, thereby exposing contact areas 134 without unduly consuming silicon material therein.

Figure 1E:
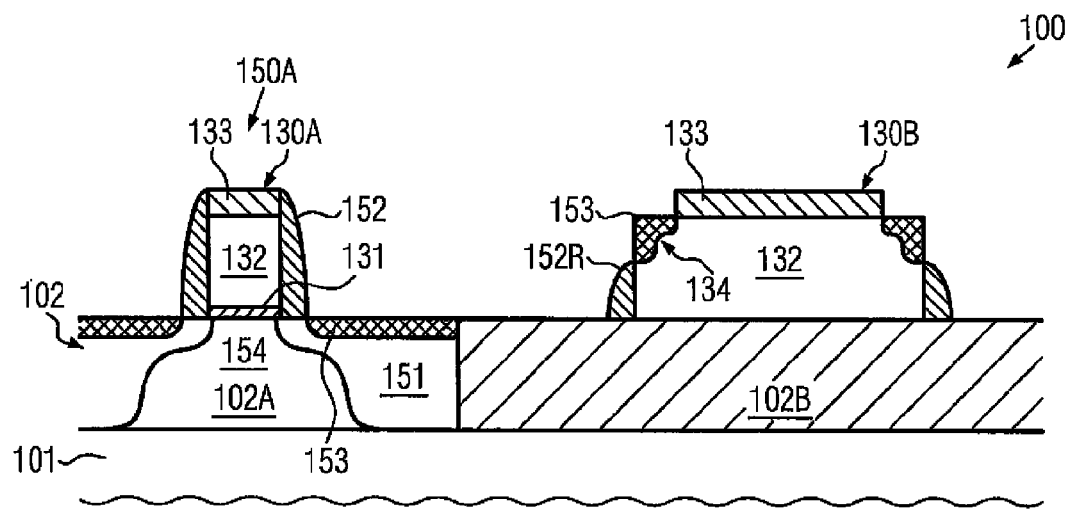

FIG. 1e schematically illustrates the semiconductor 100 in a further advanced manufacturing stage, in which the metal silicide 153 may be formed in the drain and source regions 151, while also the metal silicide 153 may be formed in the contact areas 134 in the structure 130B. To this end, any appropriate silicidation process regime may be applied after the removal of the etch mask 103 (FIG. 1c). Furthermore, as illustrated, an efficient silicidation may be accomplished due to the reduction in height of the spacer structure in the component 130B, as indicated by 152R, as a result of the preceding etch process 104 (FIG. 1d).

Consequently, if efficient contact areas, such as the areas 134, may be required in this manufacturing stage, the process sequence as described with reference to FIGS. 1c-1e will enable efficient processes with a high degree of compatibility with conventional replacement gate approaches. The further processing may be continued as will be described later on with reference to FIG. 1f, while, in other cases, the processing may be continued as is set forth in the description when referring to FIG. 1s.

Figure 1F:
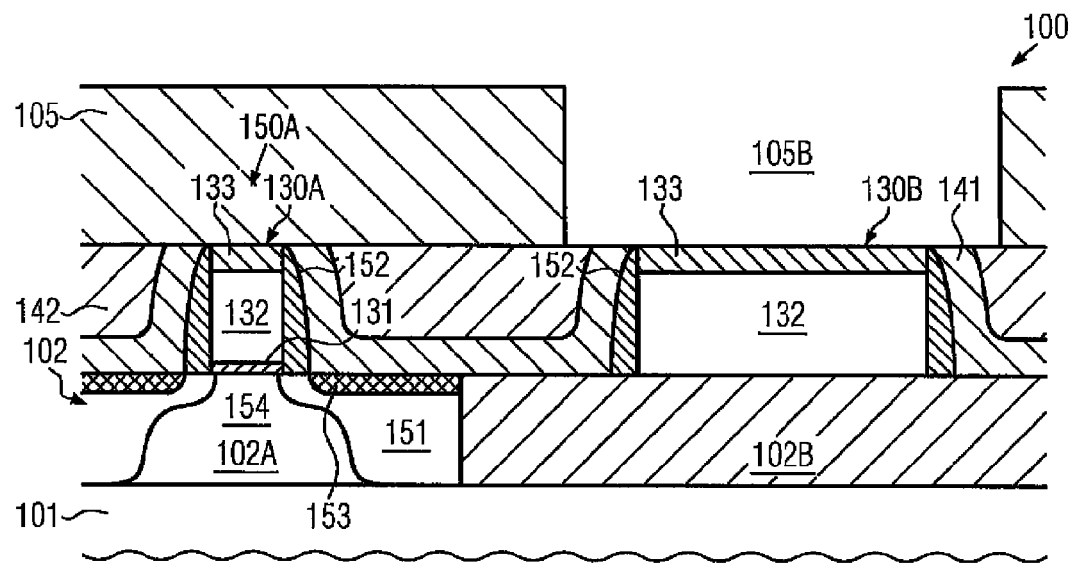
FIGS. 1f-1n schematically illustrate cross-sectional views of the semiconductor device during various manufacturing stages, wherein a replacement gate may be applied in the gate electrode structure of the transistor, while a portion of the semiconductor material in the non-transistor structure may be preserved on the basis of an additional mask material provided after the recessing of the semiconductor material in the non-transistor structure.

FIG. 1f schematically illustrates the semiconductor device 100 in a further advanced manufacturing stage, wherein it should be appreciated that the device 100 may have any appropriate configuration with respect to any contact areas in the structure 130B. For convenience, a configuration is illustrated in FIG. 1f which may be obtained on the basis of a process sequence previously described with reference to FIGS. 1a and 1b. In other cases, however, end portions of the structure 130B or any other contact areas of the structure 130B (not shown in FIG. 1f) may have received the metal silicide contact areas 134 (FIG. 1e).

As illustrated, the device 100 comprises an etch mask 105 having a mask opening 105B that is aligned to the structure 130B, while the transistor 150A is covered by the mask 105. It should be appreciated that the opening 105B is aligned to the structure 130B in a sense that at least any desired portion of the structure 130B may be exposed by the mask opening 105B, wherein, in the embodiment shown, the mask opening 105B may extend across the entire lateral dimension of the structure 130B. The etch mask 105 may be provided in the form of a resist material, a polymer material and the like that may be patterned on the basis of appropriate lithography techniques.

Figure 1G:
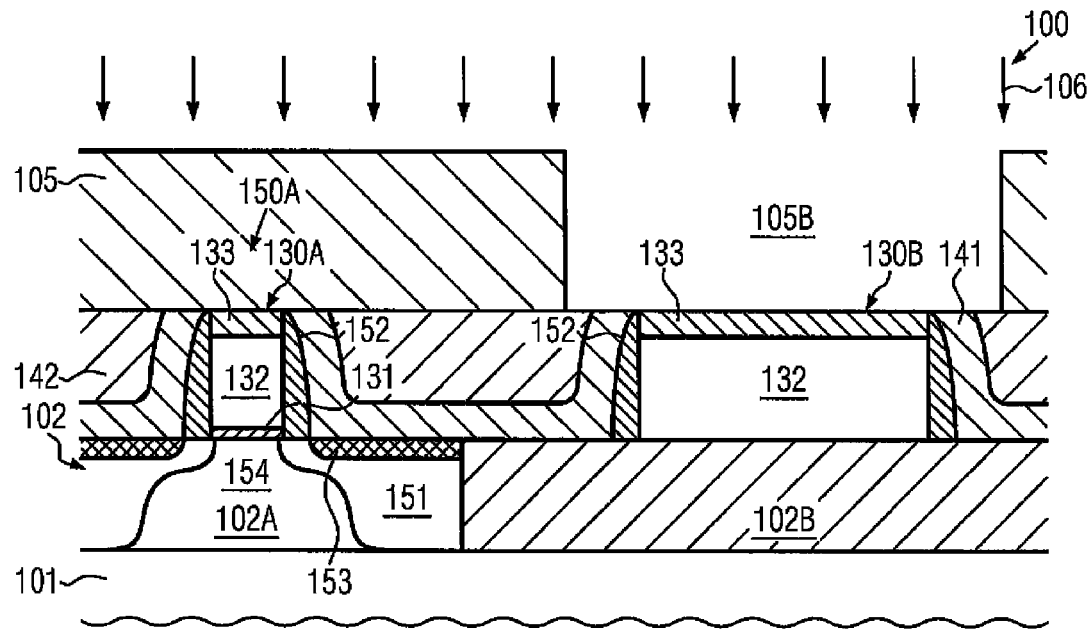

FIG. 1g schematically illustrates the semiconductor device 100 wherein an etch process 106, in which an appropriate etch chemistry may be applied, selectively removes the exposed portion of the dielectric cap layer 133. As previously discussed, there is available a plurality of highly selective etch recipes for removing silicon nitride material, which may, thus, be efficiently applied during the process 106. It should be appreciated that any other etch recipe may be applied when the material 133 is comprised of any other material species. In the embodiment shown, the etch process 106 may, thus, be performed as an etch process with a high degree of selectivity with respect to silicon material and silicon dioxide material. As previously discussed with reference to FIG. 1b, plasma assisted etch recipes are available which may provide a self-limiting removal behavior with respect to silicon material, thereby enabling a well-controlled removal of the material 133.

Figure 1H:
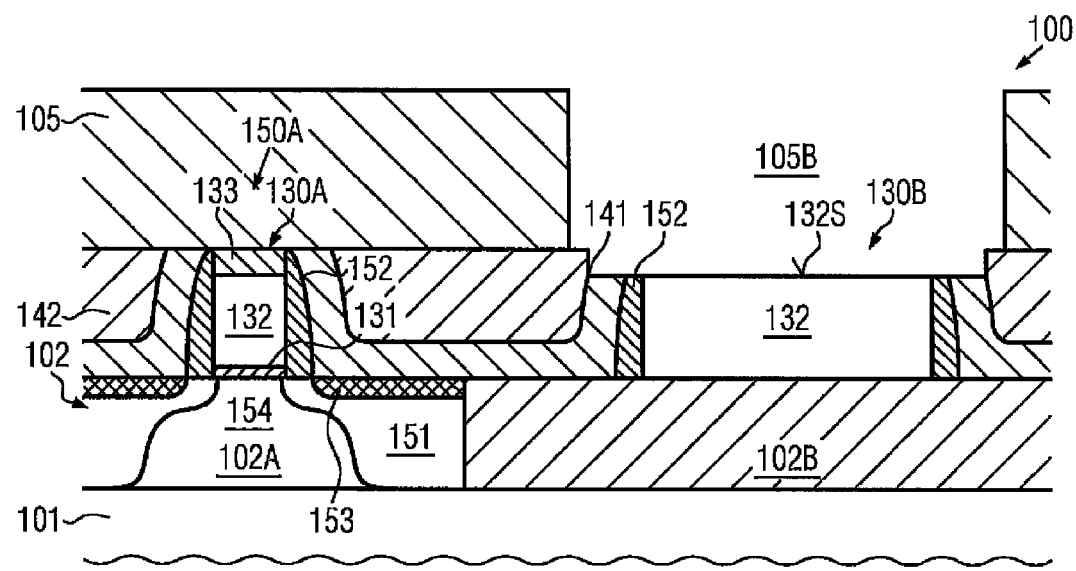

FIG. 1h schematically illustrates the semiconductor device 100 after the etch process 106 of FIG. 1g. Consequently, a surface 132S of the semiconductor material 132 may be exposed, which may, if required, involve an etch process for removing a silicon dioxide material, which may have formed in the preceding selective etch process. Furthermore, the exposed portions of the materials 152 and 141 in the structure 130B may have been removed during the preceding etch process, if comprised of a material having substantially the same etch behavior as the dielectric cap material 133.

Figure 1I:
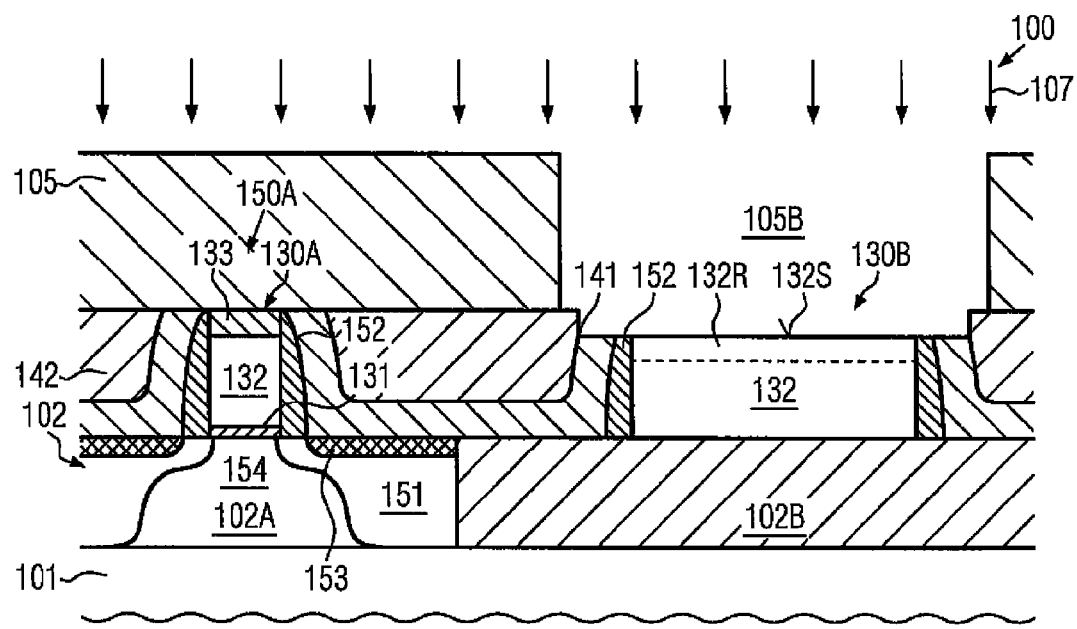

FIG. 1i schematically illustrates the device 100 when exposed to a further etch process 107, in which a portion of the semiconductor material 132 may be removed so as to form a recess 132R therein. The recess 132R may provide a reduced height level of the remaining portion of the material 132 in the structure 130B with respect to the height level of the material 132 in the gate electrode structure 130A during the further processing and may also be efficiently used for adjusting the electronic characteristics of the structure 130B. That is, upon selecting a certain depth of the recess 132R, the effective cross-sectional area of the structure 130B may be determined for otherwise given lateral dimensions, i.e., length and width. For example, the recess 132R may have a depth of approximately 10-40 nm, depending on the desired final conductivity of the structure 130B. It should be appreciated, however, that any other degree of recessing may be selected, when this is considered appropriate for the further processing. The recessing of the material 132 may be accomplished on the basis of appropriate etch recipes, for instance by using sophisticated plasma assisted etch processes, wherein efficient process parameter settings are available for silicon etch strategies, in which the gate electrode structures, such as the gate electrode structure 130A, are patterned with a high degree of selectivity, for instance with respect to silicon dioxide and the like. Any other recipes may also be applied, for instance, in a plurality of manufacturing strategies, silicon material has to be recessed in a highly controllable manner, for instance for incorporating a strain-inducing semiconductor alloy in active regions and the like, and any such recipes may be used for this purpose. Similarly, frequently, recessed drain and source configurations may be applied, in which the semiconductor material of the drain and source regions may be removed to a certain well-controlled degree based on plasma assisted or wet chemical etch recipes. Thus, by appropriately determining an etch rate for the process 107 in advance, the degree of recessing of the material 132 may be adjusted with high precision. Consequently, the electronic characteristics of the structure 130B may be adjusted on the basis of the initial height of the material 132 and the characteristics of the etch process 107, wherein any of these processes may be controlled with a high degree of precision.

Figure 1J:
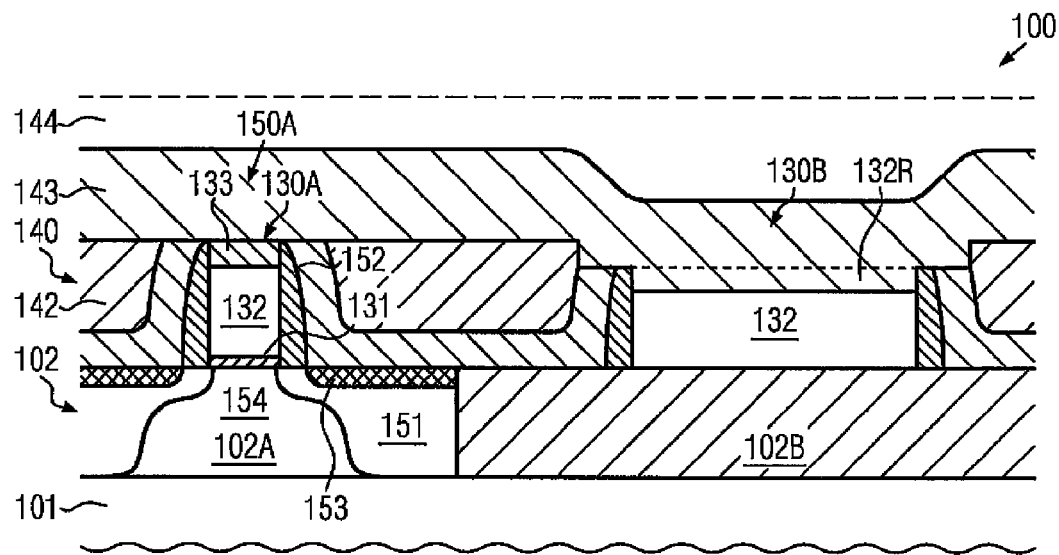

FIG. 1j schematically illustrates the device 100 with a dielectric material formed above the transistor 150A and the structure 130B, thereby refilling the recess 132R. In the embodiment shown, the dielectric material may be provided in the form of a first material layer 143, which may provide the desired integrity of the remaining material 132 in the structure 130B during the further processing. For example, the material layer 143 may be provided in the form of a silicon nitride material, thereby obtaining a high degree of controllability during the further processing, since the material 143 may have a different removal behavior compared to the material 142, which is typically provided in the form of a silicon dioxide material. It should be appreciated, however, that other materials may also be used, such as amorphous carbon and the like. Moreover, in the embodiment shown, an optional material 144 may be provided, for instance in the form of silicon dioxide and the like, thereby obtaining a superior surface topography prior to performing the subsequent material removal process. Thus, the material 143, possibly in combination with the material 144, may reliably fill the recess 132R and may also extend above the material 142. Consequently, the material 132 may have a sufficiently reduced height level in the structure 130B compared to the material 132 in the gate electrode structure 130A. It should be appreciated that any appropriate deposition techniques may be applied for providing the material 143, possibly in combination with the material 144. Next, a material removal process may be applied, for instance in the form of a CMP process, which may be performed on the basis of a non-selective process recipe so as to remove the materials 144, 143, while the exposure of extended silicon dioxide areas, i.e., the surface areas of the material 142, may be efficiently used as an indicator for controlling the corresponding removal process.

Figure 1K:
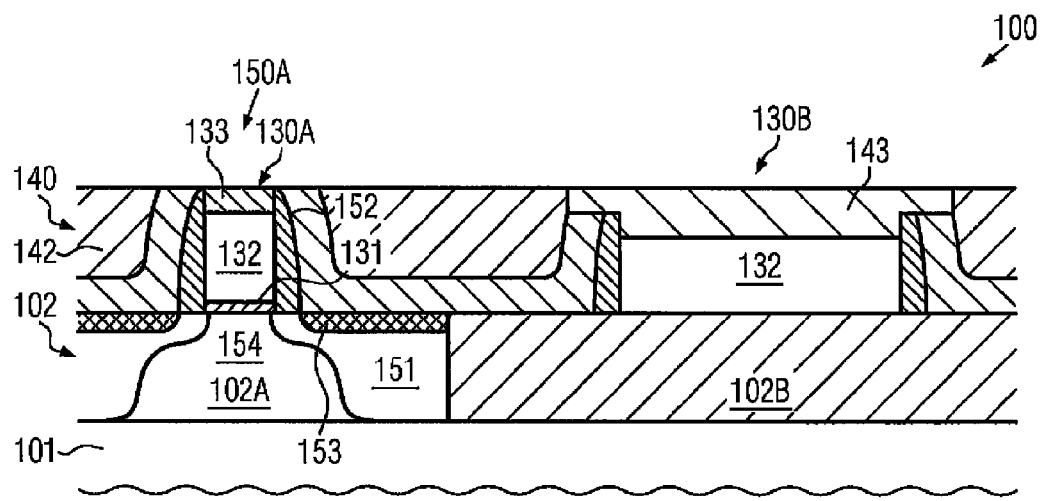

FIG. 1k schematically illustrates the semiconductor device 100 during the above-described process sequence. Hence, the device 100 may be in a similar process stage as shown in FIG. 1b, however, with a recessed material 132 in the structure 130B, thereby providing a dielectric fill material, i.e., the material 143, which may have an increased thickness compared to the dielectric cap material 133 in the gate electrode structure 130A.

Figure 1L:
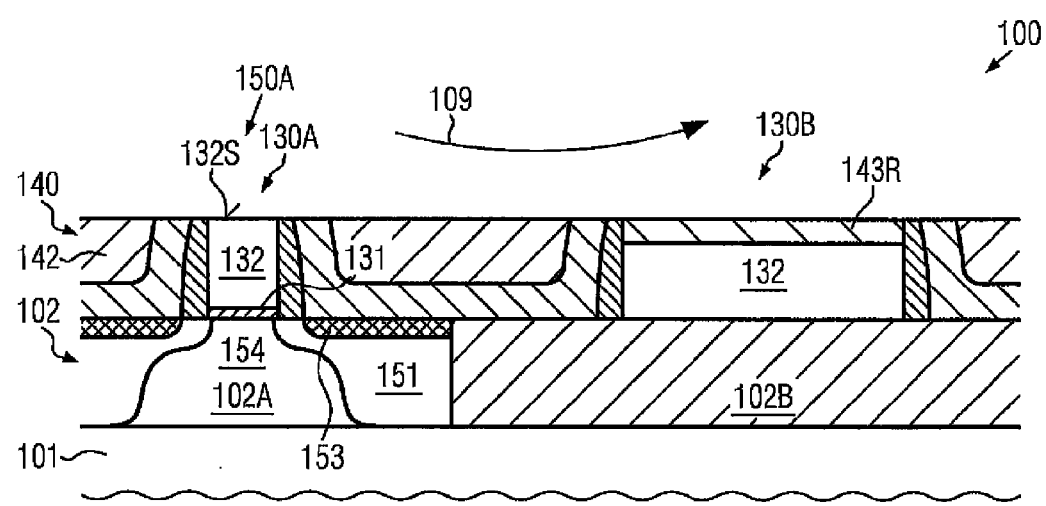

FIG. 1l schematically illustrates the device 100 when exposed to a further removal process 109, such as a CMP process, in which the dielectric cap layer 133 (FIG. 1k) of the gate electrode structure 130A may be removed, thereby also removing a portion of the material 143 (FIG. 1k) in the structure 130B. The removal process 109 may be performed on the basis of a corresponding polishing recipe, as is also typically used in conventional replacement gate approaches, thereby providing a high degree of compatibility with these process techniques. Consequently, the surface 132S of the material 132 in the gate electrode structure 130A may be reliably exposed, while the material 132 in the structure 130B may be reliably preserved due to a remaining portion 143R of the material 143 (FIG. 1k) due to the recessed configuration in the structure 130B, as discussed above. Consequently, during the process 109 and the further processing of the device 100, if desired, well-established process strategies may be applied. For example, the exposed material 132 may be removed on the basis of wet chemical etch techniques, by, for instance, TMAH (tetra methyl ammonium hydroxide), and the like, while, on the other hand, the material 143R may preserve integrity of the material 132 in the structure 130B. The dielectric material 131 may act as an efficient etch stop material and may also be removed, at least partially, if required. Next, any appropriate metal-containing material or materials may be filled in to the gate electrode structure 130A, thereby efficiently replacing the material 132 with at least a metal-containing electrode material. In some illustrative embodiments, after the removal of the material 132 and the material 131, or a portion thereof, a high-k dielectric material, which is to be understood as a dielectric material having a dielectric constant of 10.0 or higher, such as hafnium oxide, hafnium silicon oxide, zirconium oxide and the like, may be deposited so as to act as an efficient gate dielectric material.

Figure 1M:
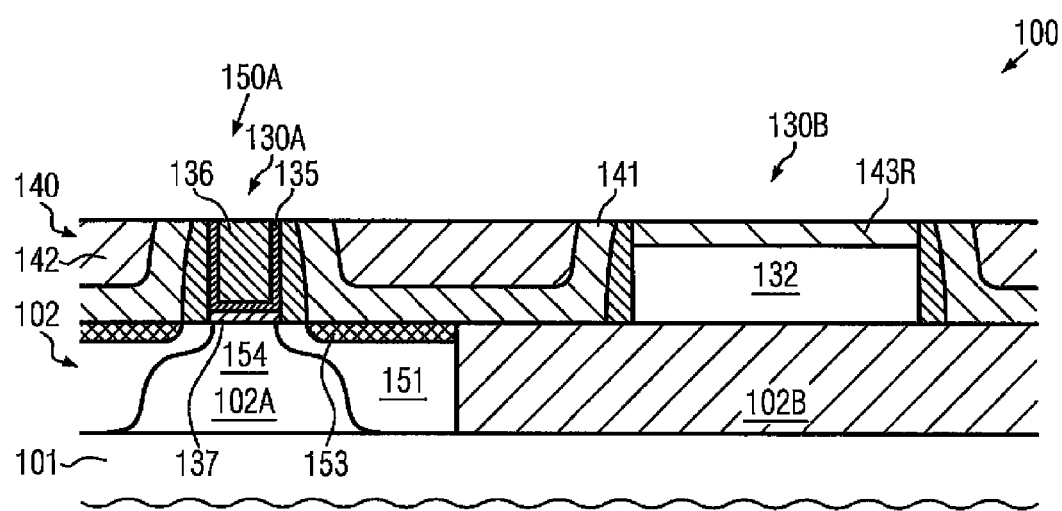

FIG. 1m schematically illustrates the device 100 in a further advanced manufacturing stage. As illustrated, the gate electrode structure 130A may comprise a high-k dielectric material 135, possibly in combination with a further dielectric material 137, which may represent the dielectric material 131 or a portion thereof, or which may have been formed after substantially completely removing the material 131 (FIG. 1l). In other cases, the high-k dielectric material 135 may be directly formed on a semiconductor material of the active region 102A, if considered appropriate. Moreover, a metal-containing electrode material 136 may be provided so as to obtain the desired electronic characteristics. That is, the material 136 may have an appropriate work function so as to appropriately adjust the threshold voltage of the transistor 150A, and may also provide a desired high conductivity of the gate electrode structure 130A. To this end, two or more different metal species may be provided in the material 136, for instance in the form of lanthanum, aluminum, titanium, tantalum and the like, depending on the overall device and process requirements. The materials 135 and 136, possibly in combination with the material 137, may be formed on the basis of any well-established process techniques. For example, the material 135 may be deposited by CVD-like deposition processes, followed by the deposition of the one or more materials 136 on the basis of sputter deposition, CVD, electrochemical deposition and the like. Thereafter, any excess material may be removed, for instance by a CMP process, wherein, if desired, the material 143R may be removed from above the semiconductor material 132 of the non-transistor structure 130B. In other cases, as for instance shown in FIG. 1*m*, a portion of material 143R may be preserved and may, thus, act as a part of a dielectric material of the contact level 140 during the further processing.

Based on the device configuration as shown in FIG. 1*m*, the further processing may be continued by depositing a further dielectric material, for instance in the form of silicon dioxide and the like, and patterning the newly deposited material in combination with the materials of the contact level 140 as shown in FIG. 1*m* in order to form contact openings therein so as to connect to the transistor 150A and the structure 130B. To this end, any appropriate contact process strategy may be applied.

Figure 1N:
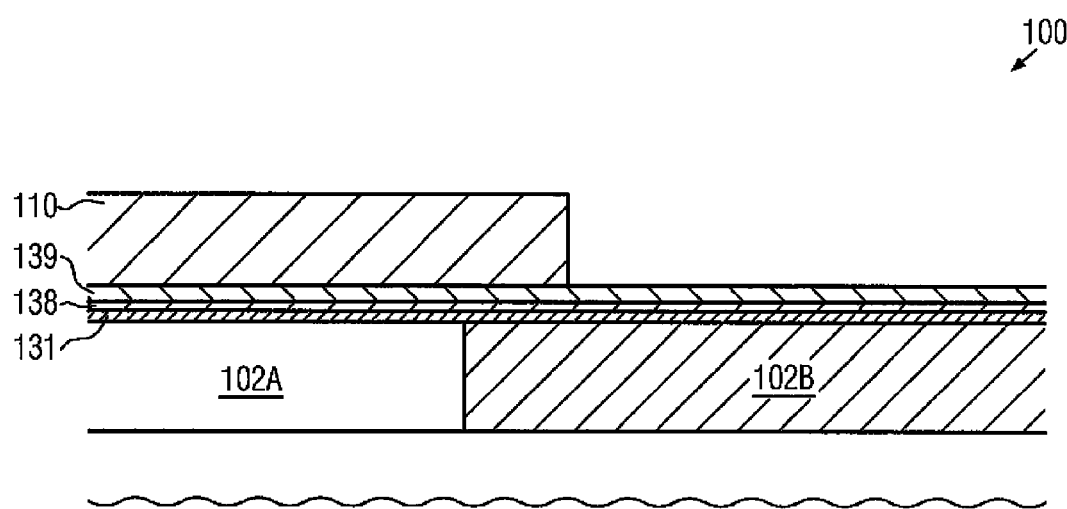
Figure 1O:
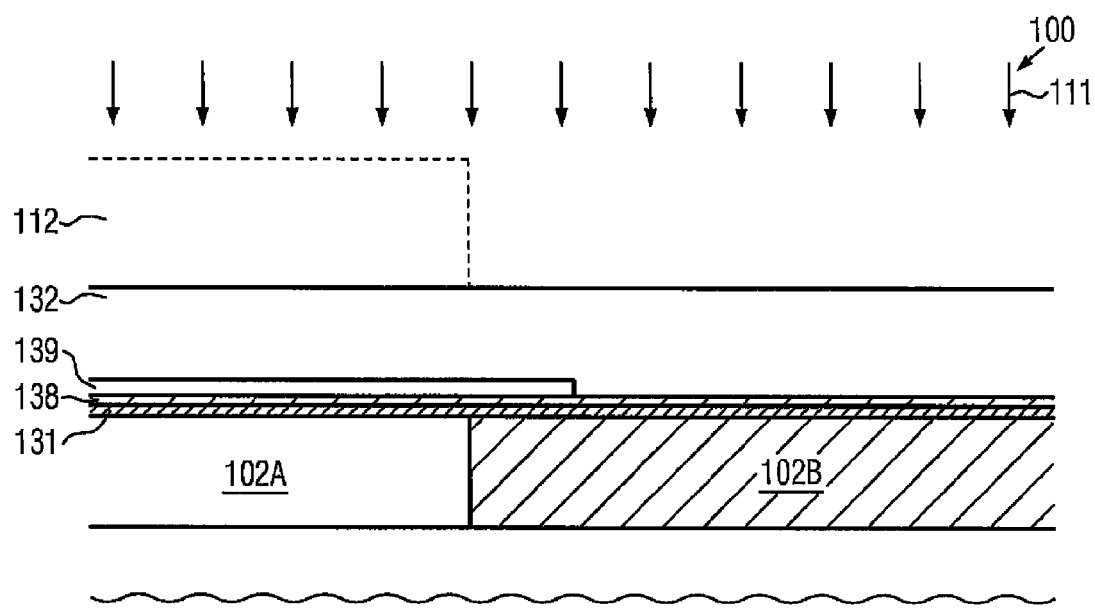
FIGS. 1o-1p schematically illustrate cross-sectional views of the semiconductor device in an early manufacturing stage, in which the high-k dielectric material in combination with the metal-containing cap material may be patterned prior to providing the semiconductor material, thereby enabling the application of a modified replacement gate approach, according to illustrative embodiments.
Figure 1P:
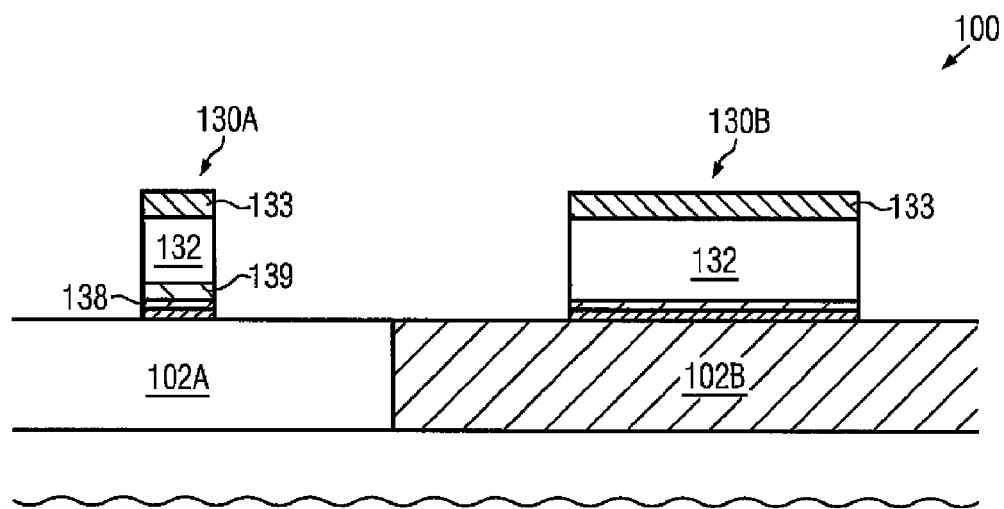

With reference to FIGS. 1*n*-1*p*, further illustrative embodiments will now be described, in which a high-k dielectric material in combination with a metal-containing cap material may be provided in an early manufacturing stage, while the actual highly conductive electrode metal, possibly in combination with work function metals, may be applied in a later manufacturing stage in accordance with a replacement gate approach.

FIG. 1*n* schematically illustrates the semiconductor device 100 in an early manufacturing stage, in which a dielectric material 131, for instance comprised of a conventional thin dielectric material, such as silicon dioxide, silicon oxynitride, may be provided in combination with a high-k dielectric material 138, such as hafnium oxide and the like. Moreover, a metal-containing cap material 139, such as a titanium nitride material and the like, may be provided so as to confine the sensitive high-k material 138. Furthermore, an etch mask 110 is provided so as to cover the active region 102A while exposing the material 139 above at least a significant portion of the isolation structure 102B. The materials 131, 138 and 139 may be provided on the basis of any appropriate process technique. After providing the etch mask 110, any appropriate etch recipe may be applied so as to at least remove the material 139, which may have a significantly higher conductivity compared to a semiconductor material, which would unduly affect the overall electronic characteristics of a non-transistor structure, such as a resistor or an electronic fuse. For example, a plurality of wet chemical etch recipes are available for etching titanium nitride, tantalum nitride and the like.

FIG. 1*o* schematically illustrates the device 100 in a further advanced manufacturing stage, in which a semiconductor material 132 may be provided above the active region 102A and the isolation structure 102B. Moreover, upon depositing the material 132, the basic conductivity may be adjusted by incorporating a specific concentration of dopants, while, in other cases, as shown, an implantation process 111 may be performed so as to introduce a desired type and concentration of a dopant species. As illustrated, the implantation process 111 may be performed as a masked implantation process, for instance by using a resist mask 112 so as to restrict the incorporation of a dopant species to certain device areas.

FIG. 1*p* schematically illustrates the device 100 in a further advanced manufacturing stage, i.e., after patterning the gate electrode structure 130A and the non-transistor structure 130B, which may not comprise at least the metal-containing cap layer 139. With respect to any patterning strategies for forming the structures 130A, 130B, it may be referred to the embodiments described above. Hence, the further processing may be continued by a process technique as described above, or as will be described below, wherein the replacing of the material 132 in the gate electrode structure 130A may include the provision of metal-containing materials without requiring the provision of a high-k dielectric material.

Figure 1Q:
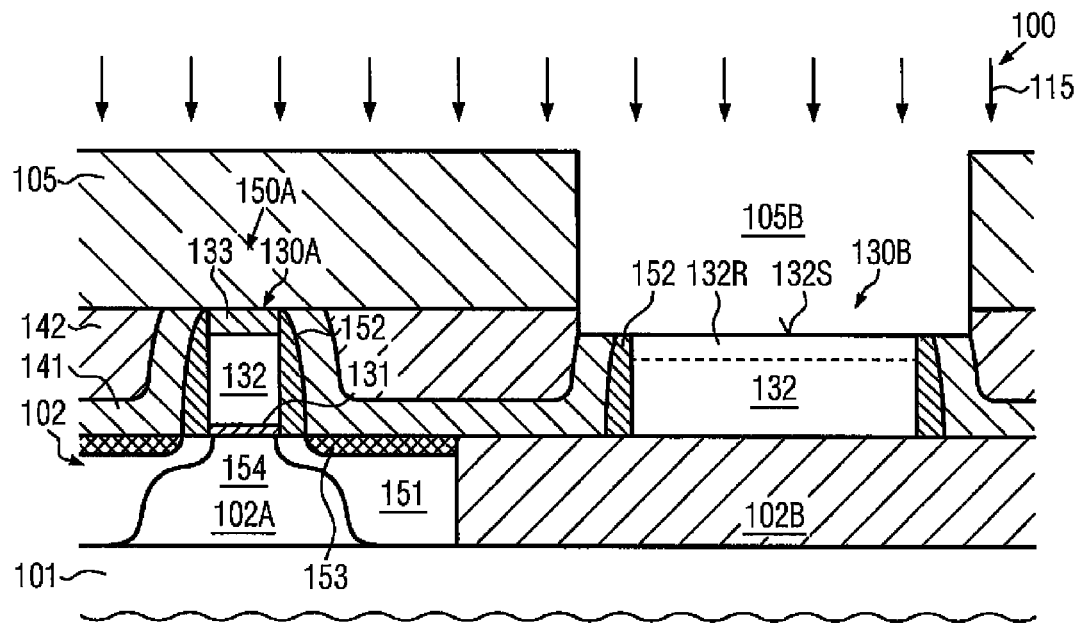
FIG. 1q schematically illustrates the semiconductor device according to illustrative embodiments in which the specific resistivity of the semiconductor material may be selectively adjusted on the basis of an ion implantation process in an advanced manufacturing stage.

FIG. 1*q* schematically illustrates the semiconductor device 100 according to further illustrative embodiments, in which the electronic characteristics of the structure 130B may be adjusted on the basis of an additional implantation process 115, which may be performed after exposure of at least the material 132 in the structure 130B. For example, the etch mask 105 may still be in place during the implantation process 115, thereby efficiently avoiding undue dopant penetration in the transistor 150A. In other cases, the mask 105 may be removed, wherein the reduced height of the structure 130B in this process stage may enable the incorporation of a dopant species down to a desired depth, while avoiding penetration of the active region 102A due to the increased height of the gate electrode structure 130A compared to the structure 130B. In other cases, the implantation process 115 may be performed after forming the recess 132R, which may thus provide even more pronounced process margins, when a corresponding implantation mask may not be provided, since, in this case, the effective height of the structure 130B may be reduced even compared to the height of the gate electrode structure 130A.

It should be appreciated that metal silicide regions 153 may not yet have been formed in the drain and source regions 151 according to some illustrative embodiments, while, in other cases, a process strategy may have been applied, as described above. After performing the implantation process 115, a further anneal process may be applied so as to activate the dopants in the structure 130B and also provide superior crystallinity, thereby also enhancing the overall dopant profile of the drain and source regions 151. Thereafter, the processing may be continued, as described above.

Figure 1R:
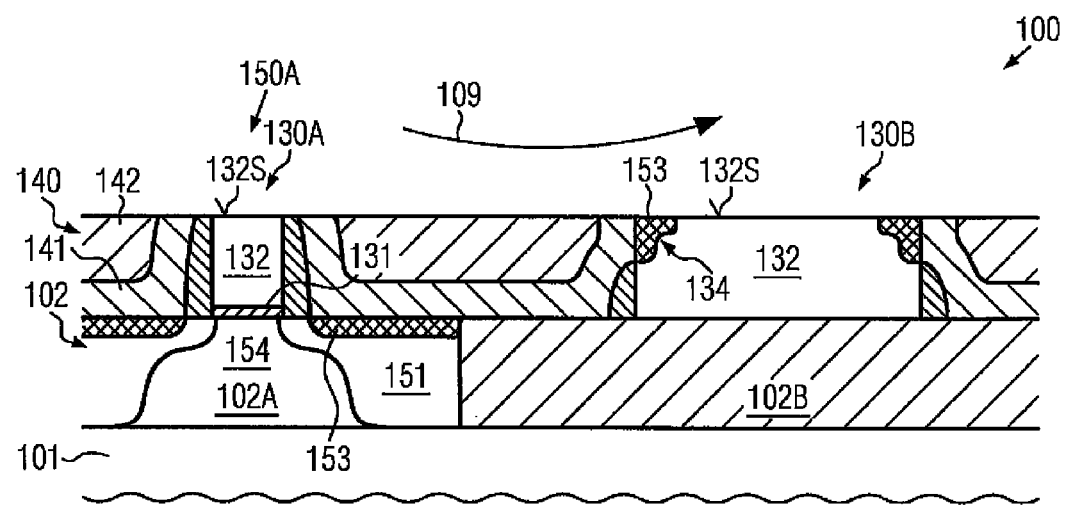
FIGS. 1r-1t schematically illustrate cross-sectional views of the semiconductor device according to still further illustrative embodiments, in which a mask layer may be provided without recessing the semiconductor material in the non-transistor structure.

FIG. 1*r* schematically illustrates the semiconductor device 100 according to further illustrative embodiments, in which the intermediate process module for recessing the material 132 in the structure 130B, as described above, may be omitted and the material 132 in the gate electrode structure 130A and the structure 130B may be commonly exposed on the basis of the removal process 109 as described above. Furthermore, as illustrated, the structure 130B may have incorporated therein the highly conductive contact areas 134 including the metal silicide 153, as is also previously described with reference to FIGS. 1*c*-1*e*. After exposing the surface 132S, the processing may be continued by depositing an appropriate mask material, such as a silicon nitride material, a silicon dioxide material and the like, which may be appropriately patterned so as to cover the structure 130B.

Figure 1S:
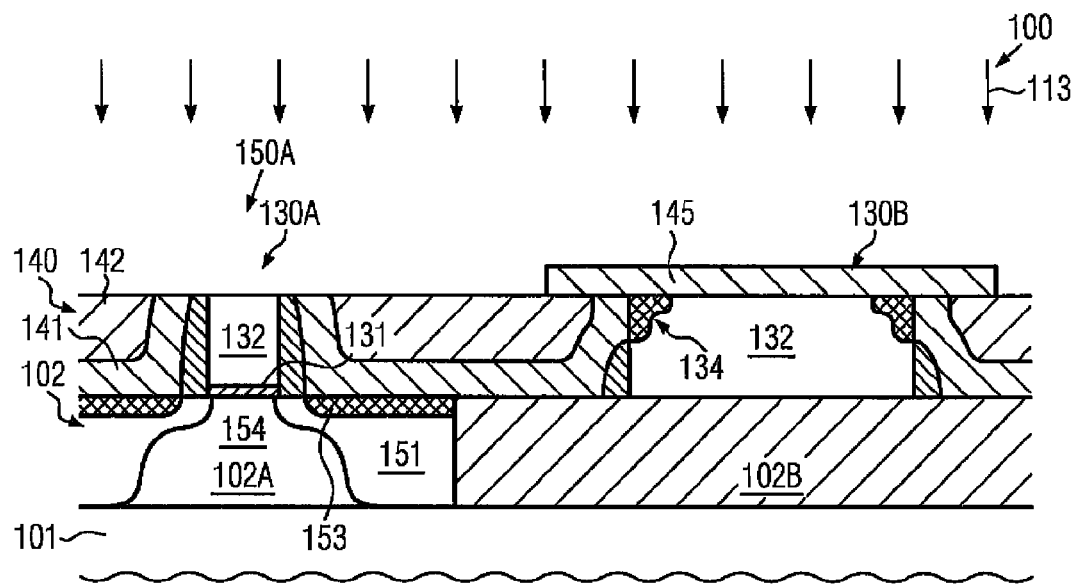

FIG. 1*s* schematically illustrates the device 100 with an etch mask 145 formed above the structure 130B. On the other hand, the exposed material 132 of the gate electrode structure 130A may be exposed to an etch process 113 performed on the basis of any appropriate etch recipe, as is also discussed above. Consequently, the integrity of the material 132 in the structure 130B may be reliably preserved.

Figure 1T:
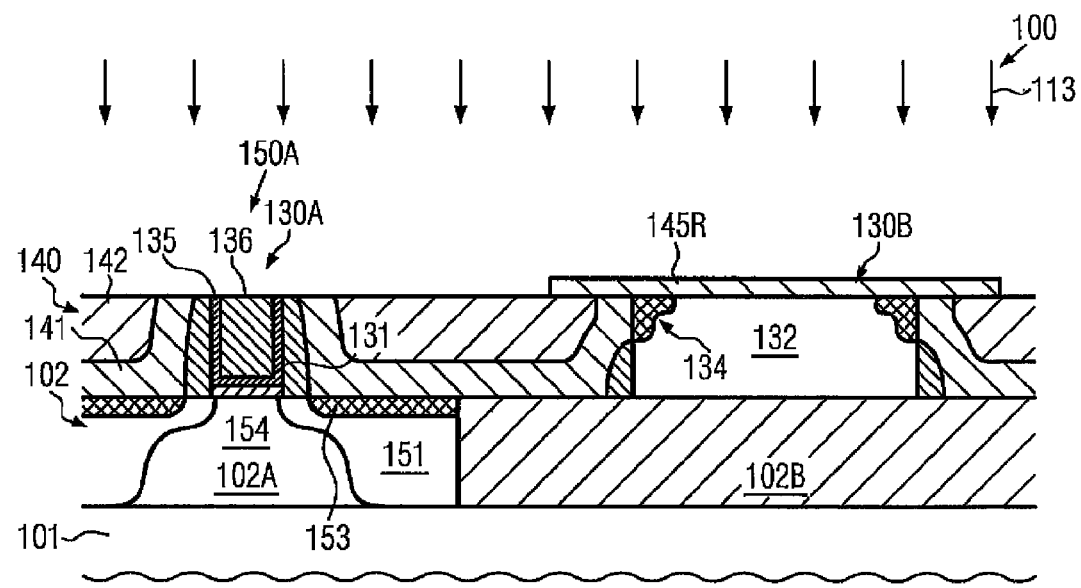

FIG. 1*t* schematically illustrates the device 100 in a further advanced manufacturing stage, in which the gate electrode structure 130A may comprise any appropriate materials, such as the high-k dielectric material 135 in combination with one or more metal-containing materials 136 for adjusting the electronic characteristics of the gate electrode structure 130A. Moreover, in the embodiment shown, the material 132 in the structure 130B may still be covered by a portion of the material 145 (FIG. 1*s*), indicated by 145R. In other illustrative embodiments (not shown), the material 145 may be completely removed in the preceding processing. That is, upon removing any excess material of the materials 135 and 136, the remaining portion 145R may also have been removed so as to expose the material 132.

Figure 1U:
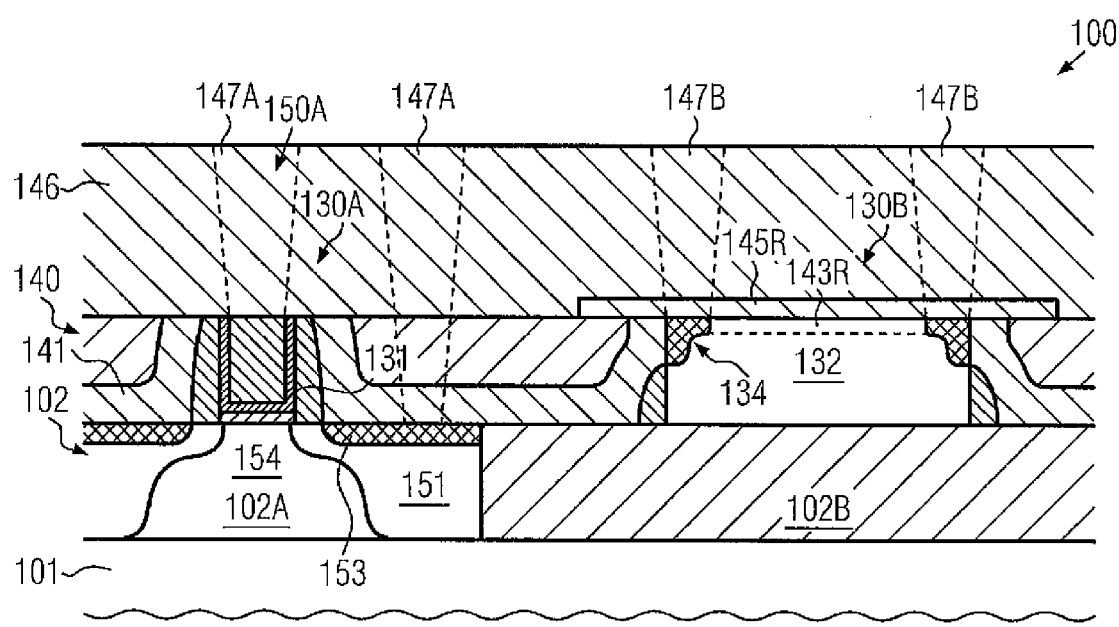
FIG. 1u schematically illustrates the semiconductor device in a further advanced manufacturing stage, in which a contact level may be provided so as to connect to the transistor and the non-transistor structure comprising a significant portion of the initially provided semiconductor material.

FIG. 1*u* schematically illustrates the semiconductor device 100 in a further advanced manufacturing stage. As illustrated, the contact level 140 of the device 100 may comprise an additional dielectric material 146, such as a silicon dioxide material, a silicon nitride material or any other appropriate dielectric material, wherein the contact level 140 may also include the portion 145R and/or the portion 143R, or any of these portions may have been removed during the preceding process sequence, as previously discussed. Moreover, contact elements 147A may be formed in the contact level 140, so as to connect to the transistor 150A, i.e., to the drain and/or source regions 151, and/or to the gate electrode structure 130A. Furthermore, contact elements 147B may be provided so as to connect to the structure 130B, i.e., to corresponding contact areas, such as the contact areas 134, which may comprise a metal silicide, which may directly connect to the material 132, depending on the overall process and device requirements. The contact elements 147A, 147B may be formed in the contact level 140 on the basis of any appropriate process strategy, for instance by depositing the material 146 and patterning this material and the materials 142 and 141 according to any appropriate process techniques. Thereafter, the corresponding contact openings may be refilled with any appropriate conductive material. It should be appreciated that, if required, the contact elements 147B, possibly in combination with contact elements 147A connecting to the gate electrode structure 130A, may be formed in a separate patterning process compared to the contact elements 147A connecting to the drain and/or source regions 151.

As a result, the present disclosure provides semiconductor devices and manufacturing techniques in which sophisticated replacement gate approaches may be applied, while, at the same time, semiconductor-based resistors, electronic fuses and the like may be provided. To this end, the semiconductor materials, such as polysilicon, silicon/germanium and the like, may be efficiently protected by dielectric material prior to replacement of the semiconductor material in the gate electrode structures, which, in some illustrative embodiments, may be associated with a recessing of the semiconductor material in the non-transistor structure. In other cases, an appropriate mask material may be applied after exposure of the semiconductor material in both the gate electrode structures and the non-transistor structures. Consequently, low-capacitance resistors and fuses may be provided on the basis of established design strategies, while nevertheless providing a high degree of compatibility with replacement gate approaches.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
   forming a mask having a mask opening aligned to a non-transistor structure, said mask covering a gate electrode structure, said gate electrode structure and said non-transistor structure comprising a semiconductor material and being at least laterally embedded in an interlayer dielectric material;
   exposing an entire upper surface of said semiconductor material in said non-transistor structure in the presence of said mask;
   removing a first portion of said exposed semiconductor material in said non-transistor structure from said entire upper surface;
   forming a dielectric material layer above said gate electrode structure and said non-transistor structure after removal of said first portion of said exposed semiconductor material;
   exposing a surface of said semiconductor material in said gate electrode structure while preserving a portion of said dielectric material layer above said non-transistor structure; and
   replacing said semiconductor material in said gate electrode structure with at least a metal-containing electrode material while preserving a remaining second portion of said semiconductor material in said non-transistor structure.

2. The method of claim 1, further comprising planarizing said interlayer dielectric material so as to expose a dielectric cap material formed in said gate electrode structure and said non-transistor structure above said semiconductor material.

3. The method of claim 2, wherein said interlayer dielectric material is planarized by performing a chemical mechanical planarization process.

4. The method of claim 1, wherein exposing a surface of said semiconductor material in said gate electrode structure comprises performing a non-selective chemical mechanical planarization process.

5. The method of claim 1, further comprising incorporating a dopant species into said semiconductor material so as to adjust a specific resistivity of said non-transistor structure.

6. The method of claim 5, wherein said dopant species is incorporated prior to patterning said gate electrode structure and said non-transistor structure from a layer stack.

7. The method of claim 5, wherein said dopant species is incorporated after forming said mask and prior to forming said dielectric layer.

8. The method of claim 1, further comprising forming a high-k dielectric material in said gate electrode structure.

9. The method of claim 8, wherein said high-k dielectric material is formed in said gate electrode structure after removal of said semiconductor material.

10. The method of claim 8, wherein forming said high-k dielectric material comprises forming a metal-containing cap layer on a layer of said high-k dielectric material and removing said metal-containing cap layer selectively from an area corresponding to said non-transistor structure.

11. The method of claim 1, wherein said non-transistor structure is one of a resistor and an electronic fuse.

12. The method of claim 11, wherein said non-transistor structure is formed above an isolation region.

13. A method of forming a semiconductor device, the method comprising:
  forming a gate electrode structure above an active region and a non-transistor structure above an isolation structure, said gate electrode structure and said non-transistor structure comprising a semiconductor material and a dielectric cap layer formed above said semiconductor material;
  forming a sidewall spacer structure on sidewalls of said gate electrode structure and said non-transistor structure;
  removing said dielectric cap layer selectively in contact areas of said non-transistor structure, while preserving said dielectric cap layer in said gate electrode structure and a portion of said non-transistor structure;
  forming a metal silicide in said contact areas and in drain and source regions of said active region in the presence of said preserved dielectric cap layer;
  forming a recess in said semiconductor material in said non-transistor structure by removing a first portion from an entire upper surface of said semiconductor material of said non-transistor structure;
  forming a dielectric material so as to laterally enclose said gate electrode structure and said non-transistor structure; and
  replacing said semiconductor material by at least a metal-containing electrode material selectively in said gate electrode structure, while preserving a remaining second portion of said semiconductor material in said non-transistor structure.

14. The method of claim 13, wherein replacing said semiconductor material by at least a metal-containing electrode material comprises performing a planarization process so as to remove said preserved dielectric cap layer in said gate electrode structure and said non-transistor structure, forming an etch mask so as to cover said non-transistor structure and removing said semiconductor material selectively in said gate electrode structure by using said etch mask.

15. The method of claim 14, wherein at least said metal-containing electrode material is formed in said gate electrode structure after removal of said semiconductor material and removing said etch mask.

16. The method of claim 14, further comprising forming an interlayer dielectric material above said gate electrode structure and said etch mask after replacing said semiconductor material by at least said metal-containing electrode material.

17. The method of claim 13, wherein replacing said semiconductor material in said gate electrode structure at least by a metal-containing electrode material comprises forming said recess in said semiconductor material in said non-transistor structure while preserving said dielectric cap layer in said gate electrode structure, forming a mask layer above said gate electrode structure and said recessed non-transistor structure and exposing said semiconductor material in said gate electrode structure by performing a planarization process.

18. The method of claim 1, wherein a height of said remaining second portion of said semiconductor material in said non-transistor structure is less than a height of said semiconductor material in said gate electrode structure.

19. The method of claim 13, wherein a height of said remaining second portion of said semiconductor material in said non-transistor structure is less than a height of said semiconductor material in said gate electrode structure.

* * * * *